United States Patent [19]
Yen et al.

[11] Patent Number: 5,633,189
[45] Date of Patent: May 27, 1997

[54] METHOD OF MAKING METAL TO METAL ANTIFUSE

[75] Inventors: Yeouchung Yen, San Jose; Shih-Oh Chen, Los Altos, both of Calif.

[73] Assignee: Actel Corporation, Sunnyvale, Calif.

[21] Appl. No.: 425,122

[22] Filed: Apr. 18, 1995

Related U.S. Application Data

[60] Division of Ser. No. 328,247, Oct. 24, 1994, Pat. No. 5,543,656, which is a continuation-in-part of Ser. No. 284,054, Aug. 1, 1994, and Ser. No. 319,170, Oct. 6, 1994, Pat. No. 5,541,441.

[51] Int. Cl.$^6$ ............................................... H01L 21/70
[52] U.S. Cl. ............................................... 438/600; 438/653
[58] Field of Search .............................. 437/60, 47, 922, 437/195, 190, 52, 229; 148/DIG. 55

[56] References Cited

U.S. PATENT DOCUMENTS

| | | | |
|---|---|---|---|
| 3,634,929 | 1/1972 | Yoshida et al. | 437/51 |
| 3,787,822 | 1/1974 | Rioult | 437/195 |
| 4,561,409 | 12/1985 | Ellsworth et al. | 123/572 |
| 4,748,490 | 5/1988 | Hollingsworth | 257/530 |
| 4,796,075 | 1/1989 | Whitten | 257/665 |
| 4,822,753 | 4/1989 | Pintchovski | 437/192 |
| 4,847,732 | 7/1989 | Stopper et al. | 257/50 |
| 4,870,302 | 9/1989 | Freeman | 326/41 |
| 4,899,205 | 2/1990 | Hamdy et al. | 257/530 |
| 4,914,055 | 4/1990 | Gordon et al. | 437/192 |
| 4,933,576 | 6/1990 | Tamamura et al. | 257/203 |
| 4,943,538 | 7/1990 | Mohsen et al. | 437/52 |
| 5,070,384 | 12/1991 | McCollum et al. | 437/193 |
| 5,095,362 | 3/1992 | Roesner | 257/330 |
| 5,100,827 | 3/1992 | Lytle | 437/52 |
| 5,120,679 | 6/1992 | Boardman et al. | 437/195 |
| 5,166,556 | 11/1992 | Hsu et al. | 437/922 |
| 5,171,715 | 12/1992 | Husher et al. | 437/195 |
| 5,191,550 | 3/1993 | Kubota | 365/96 |
| 5,194,759 | 3/1993 | El-Ayat et al. | 327/525 |
| 5,196,724 | 3/1993 | Gordon et al. | 257/530 |
| 5,233,217 | 8/1993 | Dixit et al. | 257/530 |
| 5,242,851 | 9/1993 | Choi | 437/922 |
| 5,248,632 | 9/1993 | Tung et al. | 437/195 |

(List continued on next page.)

FOREIGN PATENT DOCUMENTS

| | | |
|---|---|---|
| 8700969 | 7/1986 | European Pat. Off. . |
| 8702827 | 10/1986 | European Pat. Off. . |
| 0162529 | 3/1989 | European Pat. Off. . |
| 0323078 | 7/1989 | European Pat. Off. . |
| 0455414 | 4/1991 | European Pat. Off. . |
| 0452091 | 10/1991 | European Pat. Off. . |
| 9213359 | 1/1992 | European Pat. Off. . |
| 9220109 | 4/1992 | European Pat. Off. . |
| 9303499 | 7/1992 | European Pat. Off. . |
| 39 27 033 | 3/1990 | Germany . |
| 59098971 | 2/1985 | Japan . |

OTHER PUBLICATIONS

Burns, G.P., "Titanium dioxide formed by rapid thermal oxidation", Journal of Applied Sciences, pp. 2095–2097, Nov. 04, 1988.

Pauleau, "Interconnect Materials for VLSI Circuits", Apr., 1987, Solid State Technology, pp. 155–162.

Primary Examiner—Michael Trinh
Attorney, Agent, or Firm—D'Alessandro & Ritchie

[57] ABSTRACT

The antifuse structure of the present invention includes a bottom planarized electrode, an ILD disposed over the bottom electrode, an antifuse cell opening in and through the ILD exposing the bottom electrode, a first barrier metal layer disposed by means of collimated sputter deposition in the antifuse cell opening to form a layer of uniform thickness existing only within the antifuse cell opening in order to protect the antifuse material layer from diffusion from the bottom electrode and to form an effective bottom electrode of reduced area, hence reducing the capacitance of the device, an antifuse material layer disposed in the antifuse cell opening and over the first barrier metal layer, a second barrier metal layer disposed over the antifuse material layer and optionally formed by collimated sputter deposition, and a top electrode disposed over the second barrier metal layer.

4 Claims, 4 Drawing Sheets

U.S. PATENT DOCUMENTS

| | | | |
|---|---|---|---|
| 5,272,101 | 12/1993 | Forouhi et al. | 437/44 |
| 5,272,666 | 12/1993 | Tsang et al. | 437/192 |
| 5,290,734 | 3/1994 | Boardman et al. | 437/195 |
| 5,300,456 | 4/1994 | Tigelaar et al. | 437/195 |
| 5,308,795 | 5/1994 | Hawley et al. | 437/195 |
| 5,313,119 | 5/1994 | Cooke et al. | 307/465 |
| 5,322,812 | 6/1994 | Dixit et al. | 437/60 |
| 5,329,153 | 7/1994 | Dixit | 257/530 |
| 5,353,246 | 10/1994 | Tsang et al. | 365/96 |
| 5,401,675 | 3/1995 | Lee et al. | 437/192 |
| 5,427,981 | 6/1995 | Choi | 437/195 |
| 5,508,220 | 4/1996 | Eltoukhy et al. | 437/922 |

METHOD OF MAKING METAL TO METAL ANTIFUSE

CROSS-REFERENCES TO RELATED APPLICATIONS

This application is a divisional of U.S. patent application Ser. No. 08/328,247 filed Oct. 24, 1994 U.S. Pat. No. 5,543,656 in the name of inventors Yeouchung Yen and Shih-Oh Chen and entitled "Metal to Metal Antifuse", which is, in turn, a continuation-in-part of: (1) U.S. patent application Ser. No. 08/284,054, allowed, entitled "METAL-TO-METAL ANTIFUSES INCORPORATING VIA PLUG AND METHODS OF MAKING SAME", filed Aug. 1, 1994, in the name of inventors Abdul R. Forouhi, Frank W. Hawley, John L. McCollum and Yeouchung Yen, and (2) U.S. patent application Ser. No. 08/319,170 entitled "METAL TO METAL ANTIFUSE", filed Oct. 6, 1994, U.S. Pat. No. 5,541,441, in the name of inventors Yeouchung Yen, Shih-Oh Chen, Leuh Fang, Elaine T. Poon and James B. Kruger. The entirety of the above-identified patent applications is hereby incorporated herein by reference as if set forth fully herein.

BACKGROUND OF THE INVENTION

1. Field of the Invention

The present invention is directed to a metal-to-metal antifuse structure for use in microcircuit structures such as Field Programmable Gate Arrays (FPGAs) and the like. More particularly, the antifuse structure of the present invention comprises an antifuse cell opening in which is deposited a barrier metal by means of collimated sputtering deposition over which is deposited the antifuse material layer and then another barrier metal layer. The resulting structure is advantageous in that it can be fabricated with standard CMOS process techniques plus the addition of collimated sputtering and it provides a device having a low capacitance antifuse operable at higher speeds.

2. The Prior Art

Prior art metal-to-metal antifuse structures generally comprise a planar bottom electrode on top of which is disposed a planar barrier metal layer. An interlayer dielectric layer (ILD) is disposed over the bottom electrode structure and an antifuse cell opening is formed in the ILD to expose the bottom electrode. An antifuse material layer may then be deposited in the antifuse cell opening (or "via") and appropriate layers deposited over the antifuse material layer. The problem with this approach is that it requires a thicker barrier layer on top of the bottom electrode which is not a standard process in CMOS backend technology. For manufacturability, it is desirable to have antifuse related processes impose as little change as possible on the process technology.

OBJECTS AND ADVANTAGES OF THE INVENTION

Accordingly, it is an object of the present invention to provide a metal-to-metal antifuse structure maximizing the use of standard process steps and therefore resulting in increased manufacturability.

It is a further object of the present invention to provide a metal-to-metal antifuse having a better step coverage for the top electrode disposed within the antifuse cell opening and deposited by means of collimated sputtering.

These and many other objects and advantages of the present invention will become apparent to those of ordinary skill in the art from a consideration of the drawings and ensuing description of the invention.

SUMMARY OF THE INVENTION

The antifuse structure of the present invention includes a bottom planarized electrode, an ILD disposed over the bottom electrode, an antifuse cell opening in and through the ILD exposing the bottom electrode, a first barrier metal layer disposed by means of collimated sputter deposition in the antifuse cell opening to form a layer of uniform thickness existing only within the antifuse cell opening in order to protect the antifuse material layer from diffusion from the bottom electrode and to form an effective bottom electrode of reduced area, hence reducing the capacitance of the device, an antifuse material layer disposed in the antifuse cell-opening and over the first barrier metal layer, a second barrier metal layer disposed over the antifuse material layer and optionally formed by collimated sputter deposition, and a top electrode disposed over the second barrier metal layer.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

The present invention is directed to an improved metal-to-metal antifuse structure utilizing collimated sputter deposition to form at least the first barrier layer which provides an easily manufactured device using standard CMOS process steps in addition to collimated sputter deposition. An advantage of the novel structure is reduced capacitance with reduced capacitance over prior art metal-to-metal antifuse structures.

Figure 1:
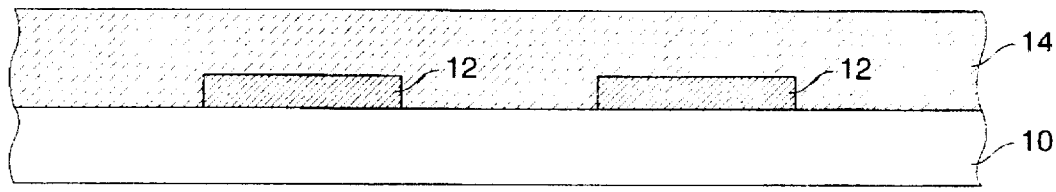
FIGS. 1–9 are diagrams showing progressive stages of construction of the metal-to-metal antifuse structure according to the present invention.
Figure 2:
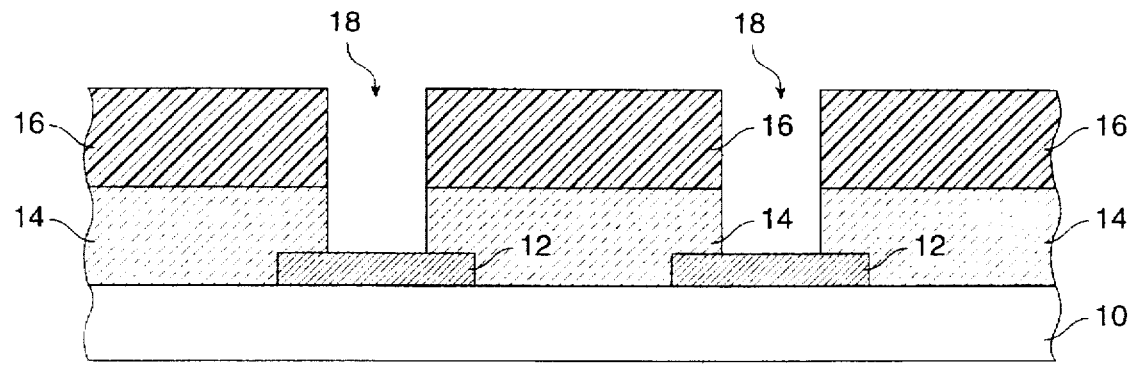
Figure 3:
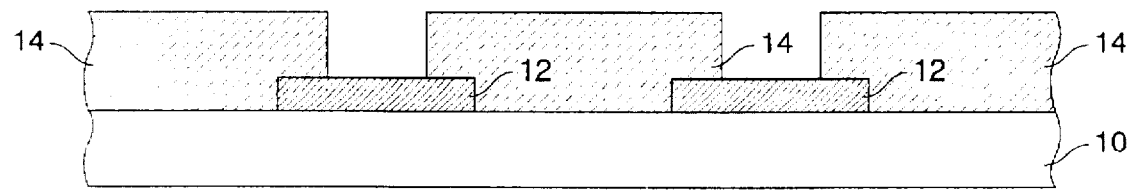
Figure 4:
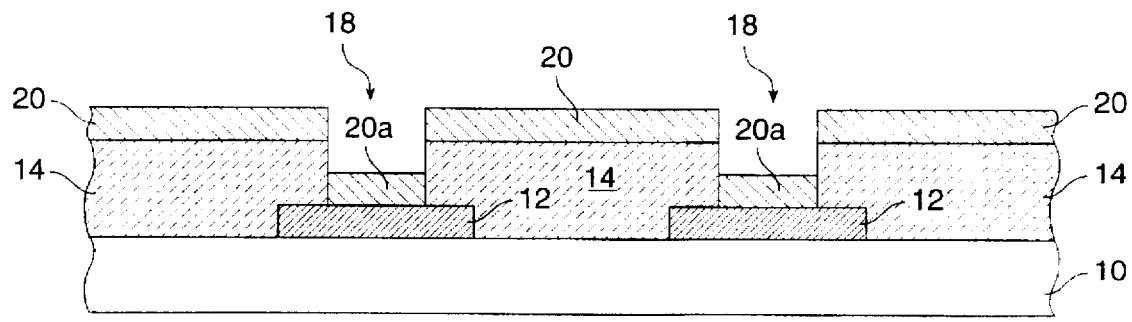

Turning to the drawings, FIG. 1 depicts a substrate 10 on which has been formed a pair of bottom electrodes 12 which will form the bottom antifuse electrode. The substrate 10 may be any insulating portion of a microcircuit or semiconductor structure. Bottom electrodes 12 are preferably aluminum of thickness in the range of 3000 Å–10000 Å with 5000 Å presently preferred. Bottom electrodes 12 can also be any standard metallization compatible with standard CMOS processes. As shown in FIG. 1, over bottom electrodes 12 is formed an interlayer dielectric layer (ILD) 14 preferably of oxide of thickness in the range of 3000 Å–10000 Å with 5000 Å presently preferred. As can be seen in FIG. 2, resist layer 16 is applied in a conventional way and antifuse cell openings 18 are opened using conventional etching techniques through ILD 14 to expose bottom electrodes 12 as shown. FIG. 3 shows the structure after stripping the resist layer 16. As shown in FIG. 4, a first barrier metal layer 20/20a is formed by collimated sputter deposition of a barrier metal material such as tungsten (W), titanium-tungsten (TiW), titanium-tungsten nitride (TiWN), titanium nitride (TiN), titanium (Ti), tungsten silicide (WSix), and combinations of the foregoing. Preferably barrier metal layer 20/20a is formed of TiN of thickness in the range of 1000 Å–3000 Å with 2000 Å presently preferred. As can be seen in FIG. 4, barrier metal layer 20 is disposed over ILD 14 and barrier metal layer 20a is disposed directly over and in contact with bottom electrodes 12 within antifuse cell openings 18.

Figure 5:
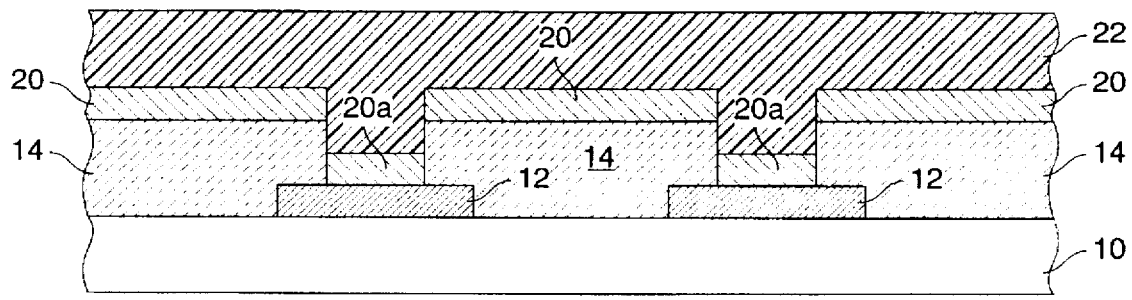
Figure 6:
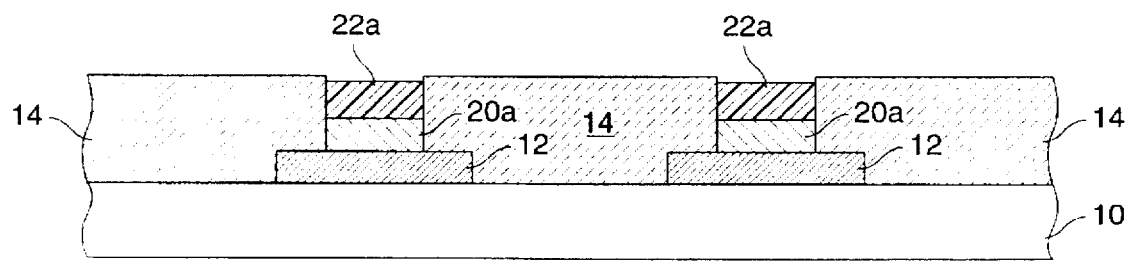
Figure 7:
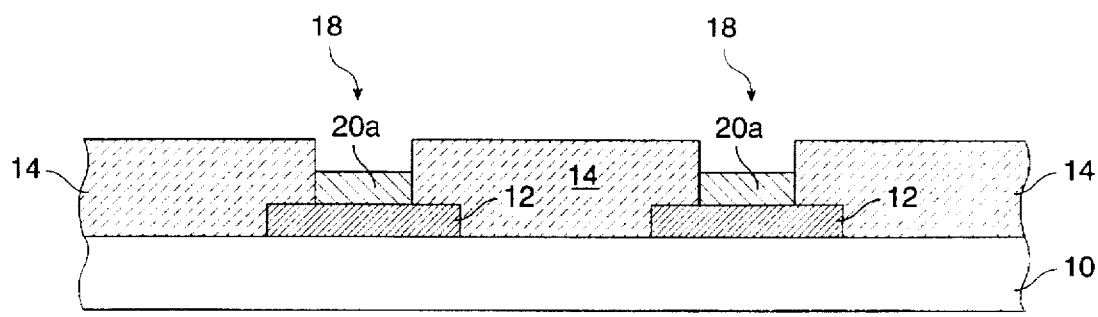

As shown in FIG. 5, a photoresist layer 22 of thickness in the range of 0.4–0.7 μm is spun on and then uniformly blanket etched back until ILD 14 is exposed to yield the structure of FIG. 6. Then the resist layer 22a remaining (FIG. 6) is stripped using conventional resist stripping techniques to yield the result shown in FIG. 7—a flat barrier metal layer 20a (Via 18 is preferably round when looking down on it).

Figure 8:
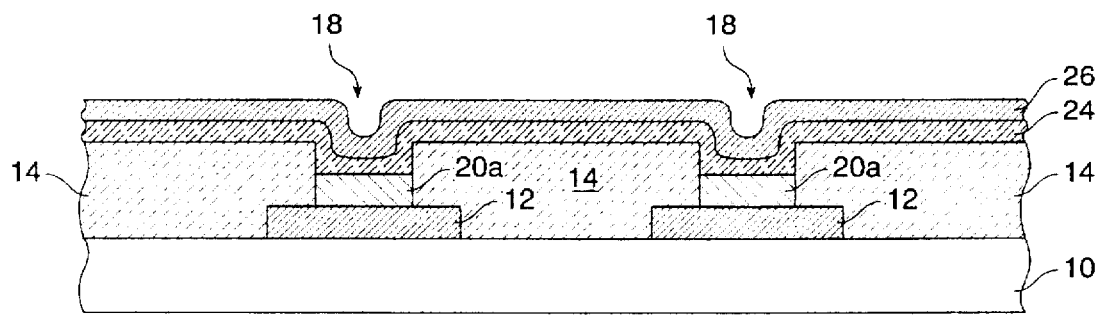

Next, as shown in FIG. 8, antifuse material layer 24 is deposited over first barrier metal layer 20a. Antifuse material layer 24 is preferably formed of a conventional nitride-amorphous silicon-nitride sandwich where the first (lower) nitride layer is preferably of thickness in the range of 70 Å–200 Å with 100 Å presently preferred; the amorphous silicon layer is preferably of thickness in the range of 300 Å–1000 Å with 500 Å presently preferred; and the second (upper) nitride layer is preferably of thickness in the range of 70 Å–200 Å with 100 Å presently preferred. Over antifuse material layer 24 is preferably deposited second barrier metal layer 26 which is preferably formed either by collimated sputter deposition or by a blanket deposit of a barrier metal material such as W, TiW, TiWN, TiN, Ti, WSix, and combinations of the foregoing. Preferably second barrier metal layer 26 is formed of TiN of thickness in the range of 1000 Å–3000 Å with 2000 Å presently preferred.

Figure 9:
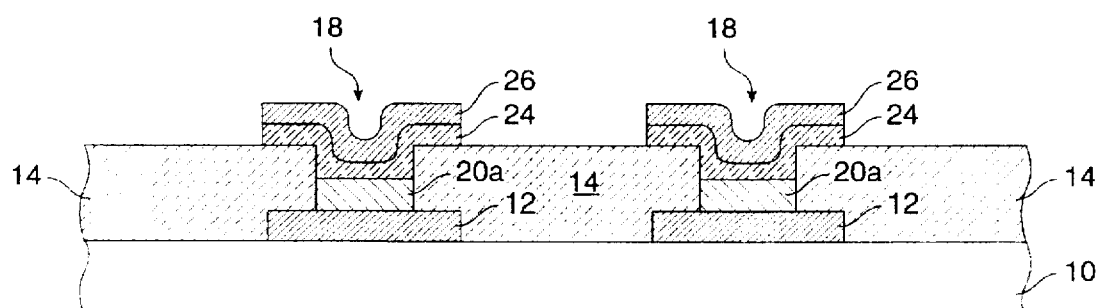
Figure 10:
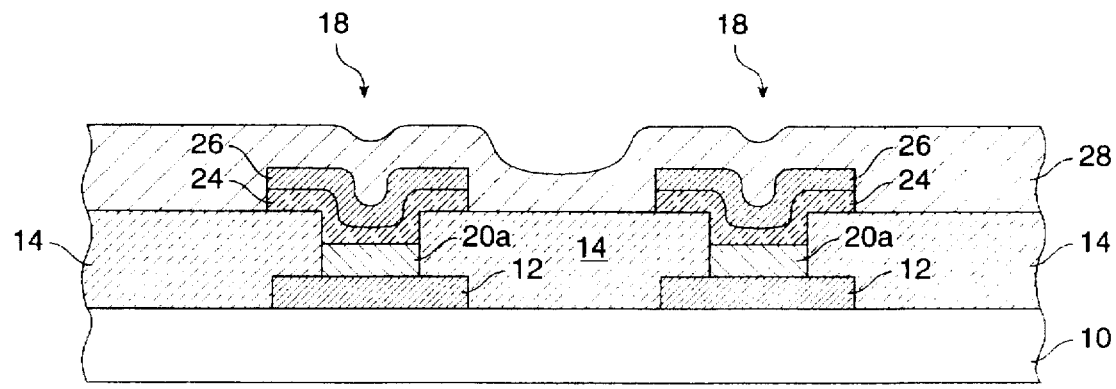
FIG. 10 is a diagram showing the completed metal-to-metal antifuse structure according to the present invention.

Next, as shown in FIG. 9, the antifuse cells are patterned and finally, as shown in FIG. 10, top electrode metallization layer 28 is formed over second barrier layer 26.

The benefits of this novel structure include its full compatibility with existing standard CMOS processes and particularly its compatibility with the standard CMOS metallization and planarization. Fuse capacitance is significantly reduced by the relatively smaller size of the first barrier metal layer versus the much larger size of the bottom electrode. Better step coverage is possible through the improved conformality for the antifuse material layer provided by the structure because the effective antifuse via depth is shallower due to the presence of the first barrier metal layer 20a within antifuse cell openings 18. Finally, a wide choice of barrier metals are available since the structure described imposes less restriction on the choice of a barrier material.

Figure 11:
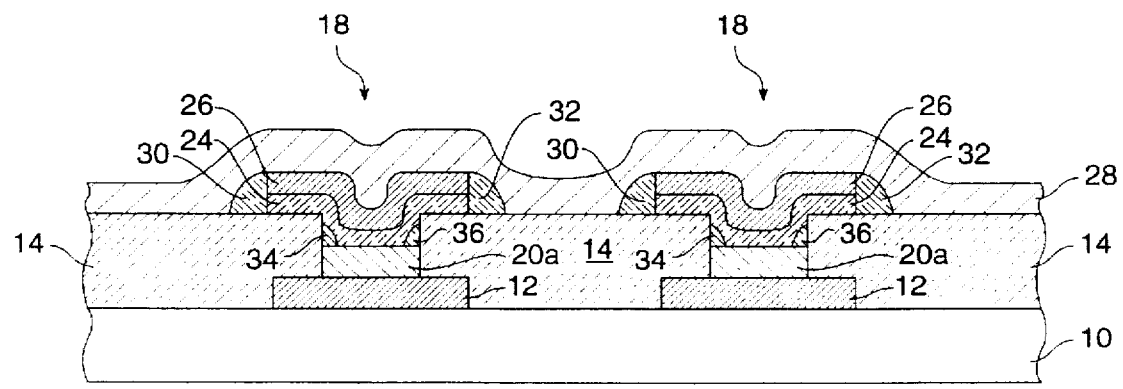
FIG. 11 is a diagram showing an alternative embodiment of the completed metal-to-metal antifuse structure according to the present invention.

According to an alternative embodiment of the present invention depicted in FIG. 11, spacers 30, 32, 34 and 36 may be added to further improve the performance of the structure as follows. Spacers 34 and 36 improve the ability of antifuse material layer 24 to conform to the shape of the bottom of antifuse cell opening 18. Spacers 30 and 32 help to isolate the aluminum in layer 28 from antifuse material layer 24 thus reducing side diffusion. Spacers 30, 32, 34 and 36 may all be constructed of silicon oxide, silicon nitride and/or amorphous silicon as is well known to those of ordinary skill in the art.

Spacers 34 and 36 reduce the capacitance of the antifuse cell because they reduce the exposed area of bottom barrier metal layer 20a.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A process for fabricating a metal-to-metal antifuse comprising the following steps:

a) forming a bottom electrode having an upper surface over an insulating portion of a microcircuit structure;

b) forming an interlayer dielectric layer over said bottom electrode;

c) etching an antifuse cell opening in and through said interlayer dielectric layer so as to expose a portion of said upper surface of said bottom electrode;

d) depositing a first barrier metal layer having a first portion over said interlayer dielectric layer and a second flat portion separated from said first portion and in said antifuse cell opening and over and in physical and electrical contact with said bottom electrode using the technique of collimated sputter deposition;

e) spin coating a layer of photoresist over said first barrier metal layer;

f) etching back said layer of photoresist and said first barrier metal layer so as to leave only a portion of said layer of photoresist in said antifuse cell opening over said second flat portion of said first barrier metal layer g) stripping said portion of said layer of photoresist from within said antifuse cell opening;

h) depositing an antifuse material layer over said flat portion of said first barrier metal layer and over said interlayer dielectric layer;

i) depositing a second barrier metal layer over said antifuse material layer;

j) patterning and etching said antifuse material layer and said second barrier metal layer; and k) forming a top electrode over said second barrier metal layer.

2. A process for fabricating a metal-to-metal antifuse according to claim 1 further including the following step which takes place between step (j) and step (k):

(l) forming a spacer of an insulating material adjacent edges formed by step (j) in said antifuse material layer and said second barrier metal layer.

3. A process for fabricating a metal-to-metal antifuse according to claim 1 further including the following step which takes place between step (g) and step (h):

(i) forming spacers of an insulating material in internal corners formed above said flat portion of said first barrier metal layer and adjacent said interlayer dielectric layer within said antifuse cell opening.

4. A process for fabricating a metal-to-metal antifuse according to claim 2 further including the following step which takes place between step (g) and step (h):

(m) forming spacers of an insulating material in internal corners formed above said flat portion of said first barrier metal layer and adjacent said interlayer dielectric layer within said antifuse cell opening.

* * * * *

UNITED STATES PATENT AND TRADEMARK OFFICE
CERTIFICATE OF CORRECTION

PATENT NO. : 5,633,189
DATED : May 27, 1997
INVENTOR(S) : Yeouchung Yen and Shih-Oh Chen It is certified that error appears in the above-indentified patent and that said Letters Patent is hereby corrected as shown below:

On the title page, item [56]:
In the References Cited section:

Title page, line 23: replace "12/1985" with --3/1987--.

In the specification:

Column 3, line 2: replace "TIN" with --TiN--.

In the claims:

Column 4, line 31: replace "layer" with --layer;--.

Signed and Sealed this

Ninth Day of September, 1997

Attest:

BRUCE LEHMAN

Attesting Officer     Commissioner of Patents and Trademarks